United States Patent [19]

Brault et al.

[11] Patent Number: 4,587,203

[45] Date of Patent: May 6, 1986

[54] WET PROCESS FOR DEVELOPING STYRENE POLYMER RESISTS FOR SUBMICRON LITHOGRAPHY

[75] Inventors: Robert G. Brault, Santa Monica; Leroy J. Miller, Canoga Park, both of Calif.

[73] Assignee: Hughes Aircraft Company, Los Angeles, Calif.

[21] Appl. No.: 737,364

[22] Filed: May 23, 1985

Related U.S. Application Data

[62] Division of Ser. No. 491,636, May 5, 1983.

[51] Int. Cl.$^4$ .......................... G03C 5/16; G03C 1/74
[52] U.S. Cl. ................................... 430/325; 430/272; 430/327; 430/270; 430/954; 430/311; 430/330; 430/331; 427/53.1; 427/54.1; 427/372.2; 427/387
[58] Field of Search ............... 430/272, 327, 270, 954, 430/311, 325, 330, 331; 427/53.1, 54.1, 372.2, 387

[56] References Cited

U.S. PATENT DOCUMENTS 2,991,204 7/1961 Astle ................................ 430/327 X
3,520,683 7/1970 Kerwin ........................... 430/327 X

OTHER PUBLICATIONS

Kaas and Kardos, "The Interaction of Alkoxy Silane Coupling Agents with Silica Surfaces", *Polymer Engineering and Science*, Jan. 1971, vol. 11, No. 1, pp. 11–18.
J. N. Helbert and H. G. Hughes, "Organosilanes as Process Compatible Adhesion Promoters for Resist Materials", *Adhesion Aspects Polym. Coat.* from a symposium meeting in 1981, edited by Kashmiri Lai Mittal, Plenum, New York, N.Y., pp. 499–508.

*Primary Examiner*—John E. Kittle
*Assistant Examiner*—Cynthia Hamilton
*Attorney, Agent, or Firm*—John A. Sarjeant; A. W. Karambelas

[57] ABSTRACT

The invention is directed to a process for preparation of a negative resist configuration on a siliceous substrate.

A negative resist polymer is bonded to the siliceous substrate using an intermediary interlayer of silane between the substrate and the resist polymer. The silane is applied to the siliceous substrate and the silane-coated surface is heated to accomplish bonding; the resist polymer is then applied as an overlay on the silane-coated surface and the resist polymer surface is irradiated to form an image therein and simultaneously to bond the resist polymer image to the silane-coated surface.

The resist image is then developed using a developer solvent to remove resist polymer which was not irradiated, and the developer solvent is followed by a rinse solvent which, in one aspect, substantially eliminates any snaky lines or edges on the developed resist image, or in another aspect, by utilizing multiple rinses to accomplish the same and to also remove substantially all of the residual developer solvent trapped within the developed resist image, thus reducing swelling and returning the initial resist to about the same dimensions as the image prior to development.

16 Claims, No Drawings

WET PROCESS FOR DEVELOPING STYRENE POLYMER RESISTS FOR SUBMICRON LITHOGRAPHY

The Government of the United States of America has rights in this invention pursuant to Contract No. N00123-79-C-0809 awarded by the Department of the Navy.

This is a division of application Ser. No. 491,636, filed 05/05/83.

BACKGROUND OF THE INVENTION

1. Field of the Invention

The invention relates to wet development of negative resist patterns (images). More particularly, the invention relates to the preparation of negative resist images substantially free of snaky lines or edges. Especially the invention relates to the preparation of negative resist images substantially free of snaky lines or edges and of a thickness substantially that of the initial resist layer. Further, the invention relates to the bonding of the irradiated resist to a siliceous substrate.

2. Description of the Prior Art

The invention is directed, in the main, to wet development of irradiated negative resist to produce a pattern (image) which is substantially undistorted from the initial pattern prior to development. Specifically, the lines, edges, and profiles are substantially free from dimensional changes such as snaking or other distortions. This development process is used in conjunction with numerous negative resist polymers which afford a range of radiation sensitivity.

When electron beam images with narrow lines, especially lines less than one m in width, are developed in negative resists, there is a pronounced tendency for the lines and edges to undergo a characteristic sinusoidal deformation that can be named "snaking". Other observers have described this line phenomenon as "sinuous lines", or "scriggily lines", or "wavy lines". These snaky lines form lateral filaments, in some instances, which cause bridging of the adjacent lines; in severe cases, snaky lines may not only bridge but merge.

It has been observed that the developed negative resist is swollen and is thicker (higher) than the thickness (elevation) of the initial resist layer. This increased thickness may introduce undesirable anomalies into the developed resist; a developed resist having substantially the thickness of the initial resist layer is preferred.

The article, "Three Dimensional Behavior of Negative Electron Resists" by R. D. Heidenreich and G. W. Kammlott, *Polymer Engineering and Science*, June 1977, Vol. 17, No. 6, pp. 377-380, is concerned with the influence of swelling in the exposed (irradiated) resist during solvent developing. The polymer used was poly(glycidyl methacrylate-co-ethyl acrylate). The developer was a solution mixture of methyl ethyl ketone and ethanol; two proportions were used: 5MEK:2 ethanol and 5MEK:1.5 ethanol. The development was by immersion. When the 5:2 solution was immediately followed by the 5:1.5 solution, the exposed resist developed lines were very scriggily. It was concluded that the poor edge definition of the developed resist is the result of swelling of the partially cross-linked polymer in the liquid developer.

The article, "Sol-Gel Behavior and Image Formation in Poly(glycidyl methacrylate) and Its Copolymers with Ethyl Acrylate, by E. D. Feit, M. E. Wurtz and G. W. Kammlott, *Journal of Vacuum Science and Technology*, 15(3), May/June 1978, pp. 944-947, is concerned with the interaction of the resist and the liquid developer. Seven samples of PGMA and eight samples of P(GMA-co-EA) were tested, using a scanning electron beam. The developer was a solution mixture of ketone and alcohol (species not specified) in proportions ranging from 3:1 to 9:1. In some instances, a high ratio solution immersion was followed by a lower ratio solution immersion. Owing to the swelling of the resist during development, lines deform and assume a sinusoidal appearance. It was concluded that faithful reproduction in the resist of a feature written by the electron beam does not depend on molecular parameters of the polymer alone, but rather on factors such as solvent induced swelling, competitive wetting of the substrate and of the polymer by the solvent, and gel rupture by forced development.

The article, "PGMA as a High Resolution, High Sensitivity Negative Electron Beam Resist", by Yoshio Taniguchi et al, *Japanese Journal of Applied Physics*, Vol. 18, No. 6, June 1979, pp. 1143-1148, is concerned with comparing resist material and concludes that PGMA is, under appropriate conditions, an excellent resist material. The samples were electron beam exposed; the development was by immersion or spraying with a solution mixture of methyl ethyl ketone an ethanol. The developed samples were rinsed for sixty seconds in methyl isobutyl ketone. The optimum developer was 6:1-10:1 solution mixture, with an immersion time of 180 seconds (40 seconds by spraying). It was observed that some resists showed line deformaton, referred to as "rough edges", which was attributed to post-baking temperatures.

The article, "Chloromethylated Polystyrene as a Dry-Etch-Resistant Negative Resist for Submicron Technology", by Saburo Imamura, *Journal of Electrochemical Society: Solid-State Science and Technology*, Vol. 126, No. 9, September 1979, pp. 1628-1630, is concerned with a new resist material, chromethylated polystyrene (CMS). As a resist material, CMS was irradiated with X-rays and with deep UV-radiation. The exposed CMS resist was developed by dipping into n-amyl acetate solvent for thirty seconds, and then rinsed in isopropyl alcohol for sixty seconds. No mention is made of resist line or edge deformation.

The article, "Molecular Parameters and Lithographic Performance of Poly(Chloromethylstyrene)—A High Performance Negative Electron Resist", by H. S. Choong and F. J. Kahn, *Journal of Vacuum Science and Technology*, 19(4), November/December 1981, pp. 1121-1126, is concerned with locating a resist material that is the equivalent of the chloromethylated polystyrene of Imamura (above). It is considered that the alkylation agent of Imamura is carcinogenic. It was found that the poly(chloromethylstyrene)polymer was equal to the Imamura polymer. The tests were carried out by exposing the resist with a scanning electron beam. The exposed resist was developed by dipping into n-pentyl acetate and then rinsed in isopropyl alcohol (as was done by Imamura). It was observed that developed lines were wavy and showed some bridging, attributed to resist swelling and the proximity of the lines.

The article, "Sensitivity and Contrast of Some Proton-Beam Resists", by Robert G. Brault and Leroy J. Miller, *Polymer Science and Engineering*, Vol. 20, No. 16, Mid-November 1980, pp. 1064-1068, is the product of the present Applicants. Positive and negative resist polymers were tested for proton-beam sensitivity. The styrene or substituted styrene polymers tested were: polystyrene, poly(4-chlorostyrene), poly(vinyltoluene), poly(vinylbenzyl chloride), poly(4-bromostyrene), poly(isopropylstyrene) and poly(4-tert-butylstyrene). A considerable range of sensitivity with both proton beam and electron beam radiation was observed. Development was by solvent only, using chlorobenzene or toluene.

The article, "A Method of Rapidly Screening Polymers as Electron Beam Resists", by Robert G. Brault and Leroy J. Miller, *Journal of Electrochemical Society*, Vol. 128, No. 5, May 1981, pp. 1158-1161, is the product of the present Applicants. In discussing the polymethacrylate positive electron resists, there is mentioned the possible use of "additional rinses with weak solvents" but no details are set forth.

SUMMARY OF THE INVENTION

In one aspect of the present invention, the invention is directed to a lithographic process for preparing a patterned resist on a substrate by applying a layer of negative resist onto a substrate, which polymer is selected from the group consisting of polystyrene, halogenated polystyrene, and substituted styrene polymer having at least one substituent, where the substituent(s) is independently selected from the group consisting of alkyl having 1-4 carbon atoms, halo, haloalkyl having 1-4 carbon atoms and at least one halo; and mixtures thereof; irradiating the resist polymer to form a negative pattern image therein; and developing that image by (i) dissolving away unexposed polymer with a developer solvent (d/s), and (ii) rinsing the wet developed resist with a rinse nonsolvent (r/ns) to eliminate substantially any snakiness of the developed resist pattern image; where the developer solvent/rinse nonsolvent combination is selected from the following Schedule 1:

| | Schedule 1 | |
|---|---|---|
| I. | (d/s) | $R_2$—(OCH$_2$CH$_2$)$_m$—O—H |
| | (r/ns) | $R_5$—(OCH$_2$CH$_2$)$_m$—OH or R—OH |
| II. | (d/s) | $R_7$—(OCH$_2$CH$_2$)$_m$—O—$R_7$ |
| | (r/ns) | $R_5$—(OCH$_2$CH$_2$)$_m$—OH or R—OH |
| III. | (d/s) | R—CO—(OCH$_2$CH$_2$)$_p$—O—(OC)$_{0-1}$—R |
| | (r/ns) | $R_5$—(OCH$_2$CH$_2$)$_m$—OH or R—OH |
| IV. | (d/s) | benzene, toluene, ethylbenzene, xylene, monochlorobenzene, monochlorotoluene, monochloroethylbenzene, monochloroxylene, ortho-dichlorobenzene, meta-dichlorobenzene, and trichlorobenzene |
| | (r/ns) | alkane having 5-8 carbon atoms, cycloalkane having 5-8 carbon atoms, and petroleum distillate boiling in the 5-8 alkane carbon atom boiling range |
| V. | (d/s) | dioxane |
| | (r/ns) | R—OH | where:
R is alkyl having 1-4 carbon atoms,
$R_2$ is alkyl having 4-8 carbon atoms,
$R_5$ is H, methyl, or ethyl,
$R_7$ is alkyl having 1-8 carbon atoms,
m is an integer equal to 1-4, and
p is an integer equal to 1-2.

In a second aspect of the present invention, the negative image is developed by dissolving away the unexposed polymer with a developer solvent, and then the web, developed resist is multiply rinsed in a series of consecutive steps using successively weaker solvents and terminating with a nonsolvent. The negative image must be maintained in a wet condition during the series of rinsing steps described above. Use of this process substantially eliminates any snaky lines or edges on the developed resist image and reduces or eliminates any swelling of the resist profile, so that the developed resist image is substantially the same as the initial exposed image prior to development. The developer solvent/rinse nonsolvents combinations are selected from the following Schedule 2, where the multiple series of rinses begins with (a) or a mixture of (a) and (b) which is rich in (a) and progress toward only (b), and where the series of rinses encompasses a minimum of two rinses:

| | Schedule 2 | |
|---|---|---|
| A. | (d/s) | $R_2$—(OCH$_2$CH$_2$)$_m$—O—H |
| | (r/ns) | (a) $R_5$—(OCH$_2$—CH$_2$)$_m$—OH |
| | | (b) R—OH |
| B. | (d/s) | $R_7$—(OCH$_2$CH$_2$)$_m$—O—$R_7$ |
| | (r/ns) | (a) $R_5$—(OCH$_2$CH$_2$)$_m$—OH |
| | | (b) R—OH |
| C. | (d/s) | R—CO—(OCH$_2$CH$_2$)$_p$—O—(OC)$_{0-1}$—R |
| | (r/ns) | (a) $R_5$—(OCH$_2$CH$_2$)$_m$—OH |
| | | (b) R—OH |
| D. | (d/s) | $R_2$—(OCH$_2$CH$_2$)$_m$—OH, mixed with $R_2$OH |
| | (r/ns) | (a) $R_2$—OH |
| | | (b) R—OH | where:
R is alkyl having 1-4 carbon atoms,
$R_2$ is alkyl having 4-8 carbon atoms,
$R_5$ is H, methyl or ethyl,
$R_7$ is alkyl having 1-8 carbon atoms,
m is an integer equal to 1-4, and
p is an integer equal to 1-2.

In a third aspect of the present invention, the invention is directed toward a process for bonding of the negative resist polymer to the siliceous substrate through use of an intermediary, interlayer of silane. In the process, a substantially unitary article is formed.

A layer of silane is applied to the surface of a siliceous substrate, which silane is:

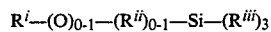

$$R^i\text{—}(O)_{0-1}\text{—}(R^{ii})_{0-1}\text{—Si—}(R^{iii})_3$$

where:
$R^i$ is acryloyl, methacryloyl, or vinyl, and when $R^i$ is vinyl, then the moiety "(O)$_{0-1}$" is absent;
$R^{ii}$ is alkylene having 2-6 carbon atoms, or $R^{iv}$—N-H—$R^v$ where $R^{iv}$ is hydroxyalkylene having 2-6 carbon atoms and $R^v$ is alkylene having 2-6 carbon atoms, and when $R^i$ is vinyl, $R^{ii}$ is absent;
$R^{iii}$ is halo, or alkoxy having 1-6 carbon atoms, or alkoxyalkoxy have at least 3-6 carbon atoms, or alkanoyloxy having a total of 2-5 carbon atoms, or alkyl having 1-6 carbon atoms, where the number of said alkyl groups present is not more than 2, and mixtures of the preceding.

The layer applied to the surface of the siliceous substrate may also be the hydrolysis product of any of the above described silanes, wherein one or more of the $R^{iii}$ groups are replaced by OH.

After application of the layer of silane, the silane-coated surface is heated to a temperature sufficient to permit a direct chemical bonding at the surface of the siliceous substrate. Typically the silane layer is heated to about 200° C. for a period of about five minutes.

A negative resist polymer resin is applied over the silane-coated surface; such resist polymer resin affords free radicals when subjected to radiation. The resist polymer resin is then irradiated (in the desired pattern) to simultaneously provide the exposed resist and form a bond between the exposed resist polymer and the silane coating, such that a substantially unitary article is obtained.

DETAILED DESCRIPTION OF THE INVENTION

Substrate

The submicron lithographic process of the invention utilizes a negative resist polymer positioned on a suitable substrate. Illustrative substrates are glassy materials, such as silicon oxide, glass, polyimides, ceramics, metals, and semiconductors such as silicon and III-V materials (such as GaAs), etc.

Note, however, that to have the bonding process described in the third aspect of the present invention, the substrate must have silica or silicon at its surface.

Negative Resist Polymer

The negative resist polymer of the wet submicron lithographic process of the invention is selected from the group consisting of (a) polystyrene; (b) halogenated polystyrene; and (c) substituted styrene polymer having at least one substituent, where the substituent(s) is selected from the group consisting of alkyl having 1-4 carbon atoms, halo and haloalkyl having 1-4 carbon atoms and at least one halo; and mixtures thereof.

Polystyrene is a solid material made by polymerizing vinylbenzene (styrene) monomer, as is well-known.

Halogenated polystyrene is a polystyrene which has been reacted to introduce chlorine or other halogen into the aromatic rings, in a random manner.

Substituted styrene polymer is prepared by polymerizing a substituted styrene monomer to form a solid polymer. The monomer may include one or more substituents independently selected from the group consisting of alkyl having 1-4 carbon atoms, halo and haloalkyl having 1-4 carbon atoms and at least one halo atom.

Illustrative halostyrene monomers include: 4-fluorostyrene, 2,5-difluorostyrene, 2-chlorostyrene, 3-chlorostyrene, 4-chlorostyrene, 2,4-dichlorostyrene, 2,5-dichlorostyrene, 2,6-dichlorostyrene, 3,4-dichlorostyrene, 2-bromostyrene, 3-bromostyrene, and 4-bromostyrene.

Illustrative alkyl substituted styrene monomers include: 4-methylstyrene, 4-ethylstyrene, 4-isopropylstyrene, 4-tert-butylstyrene, 2,4-dimethylstyrene, 2,5-dimethylstyrene, 2,6-dimethylstyrene, and 2,4,6-trimethylstyrene.

Substituted styrene monomers having both halo and alkyl substituents are readily prepared from halotoluene, haloxylene and other substituted halo and alkylbenzenes.

Illustrative haloalkylstyrene monomers include: chloromethylstyrene (vinylbenzyl chloride), dichloromethylstyrene, trichloromethylstyrene, bis(chloromethyl)styrene, chloromethyl methylstyrene (chloromethylvinyltoluene), chloromethyl dimethylstyrene (chloromethylvinylxylene), chloromethyl chlorostyrene and chloromethyldichlorostyrene.

Illustrative defined styrene polymers are set out roughly in decreasing order of preference for use in the process of the invention:

poly(4-chlorostyrene)
poly(4-bromostyrene)
poly(3-chlorostyrene)
poly(3,4-dichlorostyrene)
poly(chloromethylstyrene)
poly(2,6-dichlorostyrene)
poly(2,5-dichlorostyrene)
poly(4-tert-butylstyrene)
poly(4-isopropylstyrene)
poly(vinyltoluene)
halogenated polystyrene and
polystyrene.

It is to be understood that copolymers and terpolymers made from the above-defined monomers are suitable negative resist polymers.

The defined negative resist polymer is applied to the surface of the substrate directly, or through an appropriate bonding agent layer, in any conventional manner suitable to the particular polymer, to obtain a resist polymer coated wafer.

Irradiation

The resist polymer layer is irradiated to the desired pattern to obtain a latent image therein, by any suitable means, such as electron beam, proton beam, X-ray, UV-radiation, etc., as is well-understood in this art.

Process I

Development and Rinsing: General

Irradiation, or exposure, of the negative resist polymer produces a latent image of the desired pattern. This image is developed by treatment with a developer which is a solvent for the unexposed polymer, followed by a rinse using what would be a nonsolvent for the unexposed polymer, but which acts as a solvent for the developer solvent. The rinse permits removal of residual surface developer solvent and extraction of at least some of the developer solvent from within the resist image.

In order to distinguish these two solvents, they are referred to herein as "developer solvent" (d/s) and "rinse nonsolvent" (r/ns). Also herein, a mixture of two solvents, solvent/nonsolvent, or two nonsolvents is referred as a "solution mixture", which is a true solution of the components.

It has been observed that the combination treatment of the invention substantially eliminates any snaky lines or edges on the developed resist. It is thought the rinse nonsolvent shrinks the developer-solvent-swollen resist enough to decrease the stress in the resist to the point where the snaky edge or line returns to substantially a straight resist profile.

The negative resist polymer is cross-linked during the exposure of the pattern (image) area to radiation, and becomes insoluble or substantially less soluble in the developer solvents than the polymer in the non-exposed area(s). The solvent which dissolves away the nonexposed polymer area is referred to as the developer solvent. The developer solvent is brought into contact with the polymer coated resist area by dipping (immersion), or by spraying the resist-wafer. The time of contact is dependent on the solvent and the method of contacting; in general, for a given solvent, spraying gives the shortest time. Spraying provides continuously fresh solvent against the resist layer. However, the dipping or immersion may utilize two or more separate dips or immersions into fresh solvent for each subsequent dip or immersion. In well-known manner, trial and error quickly determines the optimum time for the particular developer solvent.

It is to be understood that the development procedure may use a different developer solvent for subsequent dips or immersions, and spraying may also be sequential. Also, the subsequent developer solvent may be a solution mixture of the developer solvent and of the rinse nonsolvent; this is in order to moderate the strength of the developer solvent.

The irradiated portion of the resist is essentially insoluble in the developer solvent, but it is able to soak up some of the developer solvent; this soak-up results in a swollen developed resist. The rinse nonsolvent does not dissolve the irradiated resist. The rinse nonsolvent will remove residual developer solvent from the surface of the developed resist and from the wafer. The rinse nonsolvent will simultaneously extract some or all of the soaked-up developer solvent, from the swollen crosslinked resist image, which decreases the stresses which are thought to cause the undesirable snaky lines and edges.

The rinse nonsolvent may be brought into contact with the developed resist by any of the procedures used for the development (for example, dip, immerse and spray). If a dip development has been used, the development should be followed immediately by a dip into a fresh portion of the same developer solvent to eliminate resist polymer-developer solvent solution from adhering to the wafer, and also to prevent re-precipitation of dissolved polymer onto the wafer surface, which can occur when the wet developed resist is contacted by the rinse nonsolvent.

Development time is not particularly critical. It has been observed that the time can vary from 30 seconds or so to as much as 180 seconds with no adverse effects. The time in the rinse nonsolvent step also does not appear to be particularly critical; times have been varied over the range of about 15 seconds to 600 seconds (10 minutes).

It has been observed that better results are obtained when the developer solvent-wet-wafer is more or less immediately contacted with rinse nonsolvent. The developed resist should not become dry between the development treatment and the rinse nonsolvent treatment. Also, the wet resist condition should be maintained between sequential solvent treatment and sequential nonsolvent treatments.

It has been observed that certain resist polymers, after exposure, afford better quality developed images when there has been an intermediate development step. After the full strength developer solvent treatment of the exposed resist, a solution mixture of that developer solvent and of intended rinse nonsolvent is applied to the wet partially developed resist to complete the development. The normal rinse nonsolvent treatment follows.

Developer Solvent/Rinse Nonsolvent Combinations

In accordance with the invention, the developer solvent (d/s)/rinse nonsolvent (r/ns) combinations useful in developing exposed resist images and in straightening snaky lines and edges are presented in formula form in Schedule 1, below.

| Schedule 1 | | |
|---|---|---|
| I. | (d/s) | $R_2$—(OCH$_2$CH$_2$)$_m$—O—H |
| | (r/ns) | $R_5$—(OCH$_2$CH$_2$)$_m$—OH or R—OH |
| II. | (d/s) | $R_7$—(OCH$_2$CH$_2$)$_m$—O—$R_7$ |
| | (r/ns) | $R_5$—(OCH$_2$CH$_2$)$_m$—OH or R—OH |
| III. | (d/s) | R—CO—(OCH$_2$CH$_2$)$_p$—O—(OC)$_{0-1}$—R |
| | (r/ns) | $R_5$—(OCH$_2$CH$_2$)$_m$—OH or R—OH |
| IV. | (d/s) | benzene, toluene, ethylbenzene, xylene, monochlorobenzene, monochlorotoluene, monochloroethylbenzene, monochloroxylene, ortho-dichlorobenzene, meta-dichlorobenzene, and trichlorobenzene |
| | (r/ns) | alkane having 5–8 carbon atoms, cycloalkane having 5–8 carbon atoms, and petroleum distillate boiling in the 5–8 alkane carbon atom boiling range |
| V. | (d/s) | dioxane |
| | (r/ns) | R—OH | where:
R is alkyl having 1–4 carbon atoms,
$R_2$ is alkyl having 4–8 carbon atoms,
$R_5$ is H, methyl, or ethyl,
$R_7$ is alkyl having 1–8 carbon atoms,
m is an integer equal to 1–4, and
p is an integer equal to 1–2.

The specific developer solvent/rinse nonsolvent combinations useful in developing exposed resist images and in straightening snaky lines and edges are presented in modified name form in Schedule 3, hereinafter.

| Schedule 3 | | |
|---|---|---|
| E. | (d/s) | ethylene glycol mono-R—ether acetate, or diethylene glycol mono-R—ether acetate, or mixtures thereof |
| | (r/ns) | ethylene glycol mono-$R_1$—ether, or alkanol having 1–4 carbon atoms |
| F. | (d/s) | ethylene glycol mono-$R_2$—ether, or diethylene glycol mono-$R_2$—ether, or mixtures thereof |
| | (r/ns) | ethylene glycol mono-$R_1$—ether, or alkanol having 1–4 carbon atoms |
| G. | (d/s) | ethylene glycol di-R—ether, or diethylene glycol di-R—ether, or triethylene glycol di-R—ether, or tetraethylene glycol di-R—ether, or mixtures thereof |
| | (r/ns) | ethylene glycol mono-$R_1$—ether, or alkanol having 1–4 carbon atoms |
| H. | (d/s) | ethylene glycol diacetate, or diethylene glycol diacetate, or triethylene glycol diacetate, or mixtures thereof |
| | (r/ns) | ethylene glycol mono-$R_1$—ether, or alkanol having 1–4 carbon atoms |
| I. | (d/s) | dioxane |
| | (r/ns) | alkanol having 1–4 carbon atoms |
| J. | (d/s) | benzene, toluene, ethylbenzene, xylene, monochlorobenzene, monochlorotoluene, monochloroethylbenzene, monochloroxylene, ortho-dichlorobenzene, meta-dichlorobenzene, and trichlorobenzene |
| | (r/ns) | alkane having 5–8 carbon atoms, cycloalkane having 5–8 carbon atoms, and petroleum distillate boiling in the 5–8 alkane carbon atom boiling range | where:
R is alkyl having 1–4 carbon atoms
$R_1$ is alkyl having 1–2 carbon atoms
$R_2$ is alkyl having 4–8 carbon atoms
Illustrative developer solvents of "E" include:
ethylene glycol monoethyl ether acetate (2-ethoxyethyl acetate; Cellosolve acetate);
ethylene glycol monobutyl ether acetate (2-butoxyethyl acetate; butyl Cellosolve acetate);

ethylene glycol monomethyl ether acetate (2-methoxyethyl acetate; methyl Cellosolve acetate);
diethylene glycol monomethyl ether acetate;
diethylene glycol monoethyl ether acetate; and
diethylene glycol monobutyl ether acetate.

Illustrative rinse nonsolvents of ethylene glycol mono-$R_1$-ether include:
ethylene glycol monomethyl ether (2-methoxyethanol; methyl Cellosolve); and ethylene glycol monoethyl ether (2-ethoxyethanol; Cellosolve); and
diethylene glycol monoethyl ether (2-[2-ethoxyethoxy]ethanol; Carbitol).

Illustrative alkanols having 1–4 carbon atoms include:
methanol, ethanol, 1-propanol, 2-propanol (isopropyl alcohol), 1-butanol, 2-butanol, and 2-methyl-1-propanol.

Illustrative mono-$R_2$-ethers of "F" include:
ethylene glycol monobutyl ether
ethylene glycol monopentyl ether
ethylene glycol monohexyl ether
diethylene glycol monobutyl ether
diethylene glycol monohexyl ether Illustrative di-R-ethers of "G" include:
ethylene glycol dimethyl ether
ethylene glycol diethyl ether
ethylene glycol dibutyl ether
diethylene glycol dimethyl ether
diethylene glycol diethyl ether
diethylene glycol dibutyl ether
triethylene glycol dimethyl ether
tetraethylene glycol dimethyl ether.

In using the dioxane solvent of "H", it is preferred to develop first with dioxane alone, followed by a mixture of dioxane and alkanol and finished with alkanol alone (for example, dioxane/dioxane:methanol mixture/methanol).

Illustrative rinse nonsolvents of "I" include:
n-pentane, isopentane, n-hexane, n-heptane, n-octane, isooctane, methylcyclopentane, cyclohexane, dimethylcyclohexane, petroleum ether and ligroin.

Developer solvent/rinse nonsolvent combinations of particular interest include:

Schedule 1(III) and Schedule 3(E):
(1) ethylene glycol monoethyl ether acetate/ethylene glycol monoethyl ether;
(2) ethylene glycol monoethyl ether acetate/2-propanol.

These combinations are particularly effective with negative resist polymers poly(4-chlorostyrene), poly(4-bromostyrene), and poly(chloromethylstyrene).

It is to be understood that a developer solvent may be modified in its solvent activity by the addition thereto of either a less effective developer solvent, or a rinse nonsolvent in the amount needed to obtain a solution mixture of the desired developer activity.

Illustrative of such solvent mixtures are:
ethylene glycol monobutyl ether diluted with n-octanol or with mixed with octyl alcohol; and ethylene glycol monoethyl ether acetate diluted with ethylene glycol monoethyl ether.

Process II

Development and Rinsing: General

It has been observed that after development with a developer solvent/rinse nonsolvent sequence, the thickness of the cross-linked resist portions may still be somewhat greater than the original thickness (height, elevation) of the initial unexposed resist layer. This is true not only for lines but also for large pads (areas), such as 25 micrometer squares. The residual swelling was observed for those radiation doses just above the minimum required to obtain an image with a thickness equal to that of the initial unexposed resist layer. There is no residual swelling when the image is developed with a good solvent and then is *not rinsed* with a nonsolvent, but this procedure causes more or less severe snaking. Both snaking and residual swelling can be substantially or totally eliminated by choosing a sequence of solvents and nonsolvents. The image is developed with a good solvent for the unexposed resist polymer. For some resists, an intermediate solvent may be applied after the good solvent treatment. The developed resist is then treated with a series of what would be poor solvents for the unexposed resist polymer. The developed resist is not allowed to dry during the series of process rinses, which begins with a poor solvent which has the greatest affinity for the exposed resist polymer and ends with a nonsolvent which has the least affinity for the exposed resist polymer. It is thought this multiple rinsing procedure permits the greatest amount of extraction of developer solvent and permits the most nearly complete restoration of the negative resist image to its initial form (prior to development).

The Process II procedure is illustrated by the development of exposed resist polymer poly(4-bromostyrene). The development treatment begins with ethylene glycol monobutyl ether acetate, followed by ethylene glycol monoethyl ether acetate. Next, the wet developed resist is rinsed with nonsolvent ethylene glycol monoethyl ether, followed by 2-propanol. The final resist image, essentially free of snaking, is essentially the same thickness as the initial resist polymer layer.

In both Processes I and II, the quality of the properly developed image varies with the radiation dose. With the optimum dose, a good clean image with the desired profile is obtained. As the dose is increased beyond the optimum, the lines get wider and the base areas of the profile demonstrate an undesired widening.

Developer Solvent//Rinse Nonsolvents Combinations

Developer solvent//rinse nonsolvents combinations that are useful in development of exposed resist and in straightening of snaky lines and edges and in decreasing swelling of the resist to about the initial resist thickness are presented in formula form in Schedule 2, hereinafter, where (a) and (b) show the sequential order of rinsing.

| Schedule 2 | | |
|---|---|---|
| A. | (d/s) | $R_2-(OCH_2CH_2)_m-O-H$ |
|    | (r/ns) | (a) $R_5-(OCH_2-CH_2)_m-OH$ |
|    |        | (b) R—OH |
| B. | (d/s) | $R_7-(OCH_2CH_2)_m-O-R_7$ |
|    | (r/ns) | (a) $R_5-(OCH_2CH_2)_m-OH$ |
|    |        | (b) R—OH |
| C. | (d/s) | $R-CO-(OCH_2CH_2)_p-O-(OC)_{0-1}-R$ |
|    | (r/ns) | (a) $R_5-(OCH_2CH_2)_m-OH$ |
|    |        | (b) R—OH |
| D. | (d/s) | $R_2-(OCH_2CH_2)_m-OH$, mixed with $R_2OH$ |
|    | (r/ns) | (a) $R_2-OH$ |
|    |        | (b) R—OH | where:
R is alkyl having 1–4 carbon atoms,
$R_2$ is alkyl having 4–8 carbon atoms, $R_5$ is H, methyl or ethyl, $R_7$ is alkyl having 1-8 carbon atoms, m is an integer equal to 1-4, and p is an integer equal to 1-2.

The specific developer solvent//rinse nonsolvents combinations useful in developing exposed resist and in straightening snaky lines and edges and in decreasing swelling of the exposed resist to about the initial resist thickness are presented in modified name form in Schedule 4 below, where (a) and (b) show the sequential order of rinsing.

| | | Schedule 4 |
|---|---|---|
| K. | (d/s) | ethylene glycol mono-R—ether acetate, or diethylene glycol mono-R—ether acetate, or mixtures thereof |
| | (r/ns) | (a) ethylene glycol mono-$R_1$—ether (b) alkanol having 1-4 carbon atoms |
| L. | (d/s) | ethylene glycol mono-$R_2$—ether, or diethylene glycol mono-$R_2$—ether, or mixtures thereof |
| | (r/ns) | (a) ethylene glycol mono-$R_1$—ether (b) alkanol having 1-4 carbon atoms |
| M. | (d/s) | ethylene glycol di-R—ether, or diethylene glycol di-R—ether, or triethylene glycol di-R—ether, or tetraethylene glycol di-R—ether, or mixtures thereof |
| | (r/ns) | (a) ethylene glycol mono-$R_1$—ether (b) alkanol having 1-4 carbon atoms |
| N. | (d/s) | ethylene glycol diacetate, or diethylene glycol diacetate, or mixtures thereof |
| | (r/ns) | (a) ethylene glycol mono-$R_1$—ether (b) alkanol having 1-4 carbon atoms | where:

R is alkyl having 1-4 carbon atoms, $R_1$ is alkyl having 1-2 carbon atoms, and $R_2$ is alkyl having 4-8 carbon atoms.

As in the aforesaid developer solvent/rinse nonsolvent treatment procedure, the wet resist condition is maintained between the various treatment steps of this developer solvent//rinse nonsolvents treatment procedure.

A variant procedure is carried out as follows: the first development is carried out with the more effective solvent of the class set out in the particular combination; then development proceeds further with a less effective solvent from that same class; then the rinse operation is carried out as set out in that particular combination.

For example, the first development solvent treatment is with ethylene glycol monobutyl ether acetate, and the second development solvent treatment is with ethylene glycol monoethyl ether acetate. This is followed by rinse nonsolvent ethylene glycol monoethyl ether, which in turn is followed by 2-propanol rinsing.

In another variant procedure, the developer solvent for a particular combination is applied full strength. This is followed by a diluted solvent made up of a mixture of the first developer solvent and a rinse nonsolvent from that particular combination. Finally, the rinse nonsolvent sequence treatment is applied.

For example, the exposed resist is first treated with developer solvent from combination "K", ethylene glycol monoethyl ether acetate. This is followed with 1:2, by volume, of a mixture of ethylene glycol monoethyl ether acetate:ethylene glycol monoethyl ether. This is in turn followed with the rinse nonsolvent sequence, ethylene glycol monoethyl ether and then 2-propanol.

Still another variant involves using two or more rinse nonsolvents from the same class, sequentially, in the rinse procedure. For example, rinsing with 2-propanol is followed by rinsing with methanol.

Developer solvent//rinse nonsolvents combinations of particular interest, in addition to the variants above, include:

Schedule 4(K):

ethylene glycol monoethyl ether acetate//ethylene glycol monoethyl ether/2-propanol.

This combination is particularly effective with negative resist polymers poly(4-chlorostyrene), poly(3-chlorostyrene), poly(chloromethylstyrene), poly(2,6-dichlorostyrene), and poly(2,5-dichlorostyrene).

Schedule 4(M):

ethylene glycol monobutyl ether//ethylene glycol monoethyl ether/2-propanol.

This combination is particularly effective with the negative resist polymer poly(4-bromostyrene).

Schedule 2(D):

A 1:2 mixture of 2-butoxyethanol and 1-octanol//1-octanol/2-propanol.

This combination is particularly effective with negative resist polymer poly(4-tert-butylstyrene).

Process III

Bonding of Resist Polymer to Siliceous Substrate Utilizing a Silane Interlayer:

Less than satisfactory adhesion existed between the hereinbefore defined styrene resist polymers and the siliceous substrate after development, in some instances.

The problem was solved by use of a silane interlayer between the styrene resist polymer and the siliceous substrate. The silane interlayer was applied directly to the surface of the siliceous substrate and the interlayer-coated surface was heated to a temperature sufficient for bonding; afterward, a layer of the styrene resist polymer was applied, overlaying the silane layer. The styrene resist polymer surface was then irradiated to simultaneously form the desired pattern image and bond this patterned image area to the silane layer. The bonded polymer-silane-substrate is a substantially unitary article.

It is indicated that the silane/irradiation bonding technique is applicable to any polymeric material which responds to radiation by producing free radicals. Such polymeric materials include, but are not limited to: polystyrene, halogenated polystyrene, and substituted styrene polymers having at least one substituent, where the substituent(s) is independently selected from the group consisting of alkyl having 1-4 carbon atoms, halo, haloalkyl having 1-4 carbon atoms and at least one halo, and mixtures thereof.

The substrates for this bonding process include any materials which have silica or silicon present at the surface of the substrate in amounts sufficient to provide the desired degree of bonding. Such substrates include, but are not limited to, silicon, silicon dioxide, fused quartz, fused silica and silca-containing glass.

Definition of Silane

When the International union of Pure and Applied Chemistry (IUPAC) issued the rules on naming of the acid halides and like compounds, the alkane and alkene series were parted at the six carbon atom compounds. The suffix, "oyl", is applied to the alkane or alkene name after dropping the final "e". However, in deference to the long time usage in both science and commerce of common names for the 1-5 carbon atom content compounds, the common names are accepted along with the IUPAC naming. Thus, we have formyl, acetyl, propionyl, butyryl, valeryl, acryl, methacryl, etc.

However, when one wishes to set forth formula series of compounds, the "yl" common names impede clarity. For this reason, the "oyl" naming is used herein, except when giving illustrations which follow the common name conventions.

The silanes which are useful in this bonding process of this invention are:

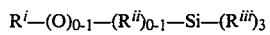

where:

$R^i$ is acryloyl, methacryloyl, or vinyl; when $R^i$ is vinyl, then the moiety "$(O)_{0-1}$" is absent;

$R^{ii}$ is alkylene having 2-6 carbon atoms, or $R^{iv}$—N—H—$R^v$, where $R^{iv}$ is hydroxyalkylene having 2-6 carbon atoms and $R^v$ is alkylene having 2-6 carbon atoms, and when $R^i$ is vinyl, $R^{ii}$ is absent;

$R^{iii}$ is halo, or alkoxy having 1-6 carbon atoms, or alkoxyalkoxy having at least 3-6 carbon atoms, or alkanoyloxy having a total of 2-5 carbon atoms, or an alkyl having 1-6 carbon atoms, where the number of said alkyl groups present is not more than 2, or mixtures of the preceding.

The layer applied to the surface of the siliceous substrate may also be the hydrolysis product of any of the above described silanes, wherein one or more of the $R^{iii}$ groups are replaced by OH.

Bonding Process

In the process of the invention, a substantially unitary article is formed, comprising a siliceous substrate (as defined above), a layer of silane (as defined above) applied to a surface of the substrate, and a polymer resin (as defined above) overlaying the silane.

The silane is bonded to the siliceous substrate by heating the silane-coated surface to about 200° C. for a period of about five minutes. The polymer resin is then applied over the silane coated surface, and the polymer-coated surface is irradiated to generate free radicals therein, to form the bond between the polymer and the silane. The final, resultant article is substantially unitary.

A preferred silane in the practice of the invention is 3-methacryloxypropyltrimethyoxysilane (common name); herein referred to as MTS or

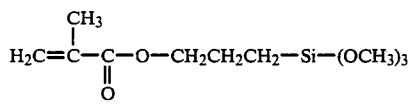

The following listing of silane compounds suitable for use in the bonding process of this invention is taken from a textbook which used the common name style:
methacryloxypropyldimethylchlorosilane
3-methacryloxypropyldimethylethoxysilane
methacryloxypropylmethyldichlorosilane
3-methacryloxypropylmethyldiethoxysilane
3-methacryloxypropyltrichlorosilane
3-methacryloxypropyltrimethoxysilane
3-methacryloxypropyltris(methoxyethoxy)silane
N-(3-acryloxy-2-hydroxypropyl)-3-amino-propyltriethoxysilane
vinyldimethylchlorosilane
vinyldimethylethoxysilane
vinylethyldichlorosilane
vinylmethyldiacetoxysilane
vinylmethyldichlorosilane
vinylmethyldiethoxysilane
vinyltriacetoxysilane
vinyltrichlorosilane
vinyltriethoxysilane
vinyltriisopropoxysilane
vinyltrimethoxysilane
vinyltris(2-methoxyethoxy)silane Example of Silane Bonding The substrate comprised a silicon wafer. A thin film of a preferred silane (MTS) was applied to one surface of the wafer from toluene solution. Solutions containing from 0.04-4 volume percent silane have been used. The coated wafer was heated to about 200° C. for five minutes in an oven. The dry wafer was coated by spin coating with poly(4-chlorostyrene). The article was irradiated to form a resist pattern image therein. The latent image was developed according to the procedure of Process II hereinbefore. The developed resist image was firmly bonded to the substrate; it appeared that the sandwich had become a substantially unitary structure or article.

Without subscribing to any particular theory, it is thought that when the resist polymer is irradiated, the free radicals generated react with the olefinic double bond in the MTS, thereby anchoring the crosslinked resist image to the MTS silane layer. It is possible, but not known whether such irradiation also activates groups(s) in the MTS to react with groups on the silicon substrate surface.

EXAMPLES OF PROCESS I AND II

In the process I examples 1-7 and in process II examples 8 and 10-13, the operation was carried out as follows:

The negative resist material was poly(4-chlorostyrene) of weight average molecular weight of $2.9 \times 10^5$ and dispersivity of 3.0. Resist solutions were prepared in chlorobenzene solvent, spin-coated on silicon wafers and baked at 50°-90° C. in a vacuum. Coated wafers were exposed with 20 keV electrons with a vector scan electron beam system. The patterns used included a matrix of 25 micrometer squares for evaluating sensitivity and a pattern consisting of twenty sets of five single-pass lines covering each decade of dose to evaluate line shape and profiles. Wafers were dip developed and rinsed in a series of developer solvents and rinse nonsolvents, or spray developed with a Thayer and Chandler air gun held about six inches from the wafer and then dip rinsed in a different developer solvent, followed by rinse nonsolvent. All images were blown dry in nitrogen and then baked at 60° C. in a vacuum for thirty minutes to remove rinse nonsolvent.

This sequential procedure resolved lines that were 0.3 micrometers wide, 0.6 micrometers high, placed an 0.7 micrometer line centers. These lines had excellent resistance to etching with a $CF_4 + O_2$ plasma. It was possible by the multiple rinse procedure of the invention to produce images without snaking and of a thickness essentially that of the initial resist coating, with lines that were as narrow as 0.25 micrometer in 0.5 micrometer thick resist coating, these lines having excellent profiles and straight sidewalls.

Also, it was observed that when the image was developed by using developer solvent alone, the lines in the image snaked very badly. In process II, examples 9 and 15–19, the operation differed from the operation described previously only as specified in the example.

Examples of Process I

Example 1

The first developer solvent was dioxane alone, dipped for 15 seconds. The following developer solvent was a solution mixture, 2:1, of dioxane and methanol, dipped for 15 seconds. The developed resist, still wet, was dipped into methanol for 300 seconds. The finished resist lines had an excellent appearance in terms of snaking and profile.

Example 2

The developer solvent was ethylene glycol monoethyl ether acetate (2-ethoxyethyl acetate) applied in two sequential portions, dipping for 15 seconds in each portion; 2-propanol was the rinse nonsolvent, dipping for 180 seconds. The appearance of the image lines was excellent.

Example 3

The developer solvent was ethylene glycol monoethyl ether acetate applied in two sequential portions, dipping for 15 seconds in each portion. Methanol was the rinse nonsolvent, dipping for 180 seconds. The appearance of the finished image lines was good when examined by an optical microscope.

Example 4

The developer solvent was ethylene glycol monoethyl ether acetate, applied in two sequential portions, dipping for 20 seconds and 10 seconds, respectively. The rinse nonsolvent was ethylene glycol monoethyl ether (2-ethoxyethanol), dipping for 180 seconds. The line appearance optically was good.

Example 5

The development/rinse operation was as in Example 4, except that the rinse nonsolvent was methanol. The optical appearance of the lines was good, but with some minor dimensional distortions.

Example 6

The development/rinse operation was as in Example 4, except that the rinse nonsolvent was 2-propanol. The optical appearance of the finished lines was good, but with some minor dimensional distortions.

Example 7

The developer solvent was monochlorobenzene, applied in two sequential portions, dipping for 15 seconds in each portion. The rinse nonsolvent was heptane, dipped for 180 seconds. The finished lines looked good optically.

Examples of Process II

Example 8

The developer solvent was ethylene glycol monoethyl ether acetate, applied in two 15 second sequential dips. The first rinse nonsolvent was 2-propanol, applied immediately, dipped for 180 seconds. The second rinse nonsolvent, applied immediately, was methanol, dipped for 180 seconds. The finished lines looked good optically.

Example 9

An image was written in a coating of poly(2,6-dichlorostyrene) on a silicon wafer using a 20 keV electron beam. The image was developed using 2-ethoxyethyl acetate, applied in two 30 second sequential dips. The first rinse nonsolvent, applied immediately, was 2-ethoxyethanol, dipped for 60 seconds. The second rinse nonsolvent, applied immediately, was 2-propanol dipped for 60 seconds. The finished lines were good with respect to snaking and resist height.

Example 10

Ethylene glycol monoethyl ether acetate was the developer solvent, applied in two 15 second dips. The first rinse nonsolvent, applied immediately, was ethylene glycol monoethyl ether, dipped for 60 seconds. The second rinse nonsolvent, applied immediately, was 2-propanol, dipped for 60 seconds. The last rinse nonsolvent was methanol, dipped for 180 seconds. The finished lines were excellent with respect to snaking and to resist height.

Example 11

Ethylene glycol monoethyl ether acetate was the developer solvent, applied in two 30 second dips. The first rinse nonsolvent was ethylene glycol monoethyl ether, dipped for 60 seconds. The second rinse nonsolvent was 2-propanol, dipped for 60 seconds. The last rinse nonsolvent was methanol, dipped for 60 seconds. The finished lines were very good with respect to snaking and to resist height.

Example 12

The developer solvent was ethylene glycol monoethyl ether acetate, applied in two 30 second dips. The first rinse nonsolvent was ethylene glycol monoethyl ether, dipped for 60 seconds. The second rinse nonsolvent was 2-propanol, dipped for 60 seconds. The finished lines were excellent with respect to snaking and to resist height. The linear dose was $2.82 \times 10^{-10}$ C/cm. Line width was 0.21 micrometer and height was 1.1 micrometer.

Example 13

The first developer solvent was ethylene glycol monoethyl ether acetate, dipped for 15 seconds. The second developer solvent was a 1:2 solution mixture of ethylene glycol monoethyl ether acetate and ethylene glycol monoethyl ether (a rinse nonsolvent), dipped for 15 seconds. The first rinse nonsolvent was ethylene glycol monoethyl ether, dipped for 60 seconds. The second rinse nonsolvent was 2-propanol, dipped for 60 seconds. The finished lines were excellent with respect to snaking and resist height. The linear dose was $3.9 \times 10^{-10}$ C/cm. The linewidth was 0.4 micrometer and gapwidth was 0.75 micrometer.

Example 14

The developer solvent was diethylene glycol monobutyl ether, applied in two portions, dipped for 60 seconds and 30 seconds, respectively. The first rinse nonsolvent, applied immediately, was ethylene glycol monoethyl ether, dipped for 45 seconds. The second rinse nonsolvent, applied immediately, was 2-propanol, dipped for 60 seconds. The finished lines were good optically with respect to snaking and resist height.

Example 15

The resist polymer was poly(4-bromostyrene); this was dosed with radiation at $10^{-4}$ to $10^{-5}$ C/cm$^2$. The first developer solvent was ethylene glycol monobutyl ether acetate, dipped for 60 seconds. The second developer solvent was ethylene glycol monoethyl ether acetate, dipped for 30 seconds. The first rinse nonsolvent, applied immediately, was ethylene glycol monoethyl ether, dipped for 60 seconds. The second rinse nonsolvent, applied immediately, was 2-propanol, dipped for 15 seconds. The finished lines were excellent with respect to snaking and resist height.

Example 16

An image was written in a 500 angstrom thick coating of poly(4-tert-butylstyrene) on a silicon wafer using a 70 keV Ga+ beam. The image was developed using a 3:1 mixture of octyl alcohol:2-butoxyethanol, applied in two sequential dips of 60 seconds each. The first rinse nonsolvent, applied immediately, was octyl alcohol, dipped for 60 seconds. The second rinse nonsolvent, applied immediately, was isopropyl alcohol, dipped for 60 seconds. The finished lines were narrow and straight.

Example 17

An image was written in a 1,500 angstrom thick coating of poly(2,5-dichlorostyrene) on a silicon wafer using a 70 keV Si++ beam. The image was developed using 2-ethoxyethyl acetate, applied in two sequential dips of 30 seconds each. The first rinse nonsolvent, applied immediately, was 2-ethyoxyethanol, dipped for 60 seconds. The second rinse nonsolvent, applied immediately, was isopropyl alcohol, dipped for 60 seconds. The finished lines were moderately good optically, with respect to line width and were good with respect to snaking and resist height.

Example 18

An image was written in 6,000 angstrom thick coating of poly(3-chlorostyrene) on a silicon wafer using a 20 keV electron beam. One image was developed using each of the following two procedures:

(1) The image was developed using 2-ethoxyethyl acetate, applied in two sequential dips of 15 seconds each. The first rinse nonsolvent, applied immediately, was 2-ethoxyethanol, dipped for 60 seconds. The second rinse nonsolvent, applied immediately, was isopropyl alcohol, dipped for 180 seconds.

(2) The image was developed using 2-butoxyethyl acetate, applied in two sequential dips of 20 seconds followed by 10 seconds. The first rinse nonsolvent, applied immediately, was 2-ethoxyethanol, dipped for 60 seconds. The second rinse nonsolvent, applied immediately, was isopropyl alcohol, dipped for 180 seconds.

The finished lines were very straight and the line profiles were excellent for both of the procedures described in this example.

It is obvious that the development and rinsing procedures described in Process I and Process II can be used independently of the bonding procedure described in Process III and still result in substantial improvement in the production of negative resists over those obtainable using the prior art. However, it is the use of the bonding procedure in preparation of the exposed negative resist image combined with the development and rinse procedure described in Process I or Process II which permits maximum benefit from the teachings of this invention.

What is claimed is:

1. A process for preparing negative resists on a substrate which includes bonding polymer resins to a siliceous substrate and lithographically preparing a patterned resist on said substrate, which process comprises:

A. forming an article consisting essentially of:
   (1) a siliceous substrate;
   (2) a layer of silane on a surface of said substrate, which silane is: $R^{i}—(O)_{0-1}—(R^{ii})_{0-1}—Si—(R^{iii})_3$ or the hydrolysis products thereof and wherein one or more of the $R^{iii}$ groups are replaced by OH;

where:

$R^{i}$ is acryloyl, methacryloyl, or vinyl, and when $R^{i}$ is vinyl, then the moiety "$(O)_{0-1}$" is absent;

$R^{ii}$ is alkylene having 2-6 carbon atoms, or $R^{iv}—N-H—R^{v}$ where $R^{iv}$ is hydroxyalkylene having 2-6 carbon atoms and $R^{v}$ is alkylene having 2-6 carbon atoms, and when $R^{i}$ is vinyl, $R^{ii}$ is absent;

$R^{iii}$ is halo, or alkoxy having 1-6 carbon atoms, or alkoxyalkoxy having at least 3-6 carbon atoms, or alkanoyloxy having a total of 2-5 carbon atoms, or an alkyl having 1-6 carbon atoms, where the number of said alkyl groups present is not more than 2, and mixtures thereof; and (3) a polymer resin overlaying said silane, which resin affords free radicals when subjected to radiation and is selected from the group consisting of:
   (a) polystyrene,
   (b) halogenated polystyrene, and
   (c) substituted styrene polymer, where the substituted monomer has at least one substituent selected from the group consisting of alkyl having 1-4 carbon atoms, halo, haloalkyl having 1-4 carbon atoms and at least one halo; and
   (d) mixtures thereof;

B. applying said layer of silane to the siliceous substrate, heating the silane-coated surface of the substrate to form a bond between the silane and the substrate, then applying the polymer resin overlay to the silane coated surface, and irradiating the polymer-overlaid surface (1) to generate free radicals at the polymer-silane interface so as to form a bond between the silane and the polymer overlay, so that a substantially unitary article is obtained, and (2) to form a negative pattern image therein; and C. developing said image by
   (i) dissolving away unexposed polymer with a developer solvent, and
   (ii) rinsing said wet developed resist with a nonsolvent to eliminate substantially any snakiness of the developed resist pattern image;

where said developer solvent/rinse nonsolvent combination is selected from the following schedule, wherein (d/s) is developer solvent and (r/ns) is rinse nonsolvent:

| | | |
|---|---|---|
| I. | (d/s) | $R_2—(OCH_2CH_2)_m—O—H$ |
| | (r/ns) | $R_5—(OCH_2CH_2)_m—OH$ or $R—OH$ |
| II. | (d/s) | $R_7—(OCH_2CH_2)_m—O—R_7$ |
| | (r/ns) | $R_5—(OCH_2CH_2)_m—OH$ or $R—OH$ |
| III. | (d/s) | $R—CO—(OCH_2CH_2)_p—O—(OC)_{0-1}—R$ |
| | (r/ns) | $R_5—(OCH_2CH_2)_m—OH$ or $R—OH$ |
| IV. | (d/s) | benzene, toluene, ethylbenzene, xylene, monochlorobenzene, monochlorotoluene, monochloroethylbenzene, monochloroxylene, ortho-dichlorobenzene, meta-dichlorobenzene, and trichlorobenzene |
| | (r/ns) | alkane having 5-8 carbon atoms, cycloalkane having 5-8 carbon atoms, and petroleum distillate boiling in the 5-8 alkane carbon atom boiling range |
| V. | (d/s) | dioxane |
| | (r/ns) | R—OH | where:

R is alkyl having 1-4 carbon atoms,
$R_2$ is alkyl having 4-8 carbon atoms,
$R_5$ is H, methyl, or ethyl,
$R_7$ is alkyl having 1-8 carbon atoms,
m is an integer equal to 1-4, and p is an integer equal to 1–2.

2. The process of claim 1 wherein said silane is 3-methacryloxypropyltrimethoxysilane.

3. The process of claim 1 wherein said resist polymer is selected from the group consisting of poly(3-chlorostyrene), poly(4-chlorostyrene), poly(2,5-dichlorostyrene), poly(2,6-dichlorostyrene), poly(3,4-dichlorostyrene), poly(4-bromostyrene), poly(chloromethylstyrene), and poly(4-tert-butylstyrene).

4. The process of claim 1 wherein said developer solvent/rinse nonsolvent combination is selected from the following schedule:

| E. | (d/s) | ethylene glycol mono-R—ether acetate, or diethylene glycol mono-R—ether acetate, or mixtures thereof |
| | (r/ns) | ethylene glycol mono-$R_1$—ether, or alkanol having 1–4 carbon atoms |
| F. | (d/s) | ethylene glycol mono-$R_2$—ether, or diethylene glycol mono-$R_2$—ether, or mixtures thereof |
| | (r/ns) | ethylene glycol mono-$R_1$—ether, or alkanol having 1–4 carbon atoms |
| G. | (d/s) | ethylene glycol di-R—ether, or diethylene glycol di-R—ether, or triethylene glycol di-R—ether, or tetraethylene glycol di-R—ether, or mixtures thereof |
| | (r/ns) | ethylene glycol mono-$R_1$—ether, or alkanol having 1–4 carbon atoms |
| H. | (d/s) | ethylene glycol diacetate, or diethylene glycol diacetate, or triethylene glycol diacetate, or mixtures thereof |
| | (r/ns) | ethylene glycol mono-$R_1$—ether, or alkanol having 1–4 carbon atoms |
| I. | (d/s) | dioxane |
| | (r/ns) | alkanol having 1–4 carbon atoms |
| J. | (d/s) | benzene, toluene, ethylbenzene, xylene, monochlorobenzene, monochlorotoluene, monochloroethylbenzene, monochloroxylene, ortho-dichlorobenzene, meta-dichlorobenzene, and trichlorobenzene |
| | (r/ns) | alkane having 5–8 carbon atoms, cycloalkane having 5–8 carbon atoms, and petroleum distillate boiling in the 5–8 alkane carbon atom boiling range | where:
R is alkyl having 1–4 carbon atoms,
$R_1$ is alkyl having 1–2 carbon atoms, and
$R_2$ is alkyl having 4–8 carbon atoms.

5. The process of claim 4 wherein said developer/rinse combination is ethylene glycol monoethyl ether acetate/2-propanol.

6. The process of claim 4 wherein said developer/rinse combination is ethylene glycol monoethyl ether acetate/ethylene glycol monoethyl ether.

7. The process of claim 4 wherein said developer/rinse combination is ethylene glycol monobutyl ether/ethylene glycol monoethyl ether.

8. The process of claim 4 wherein said developer is dioxane and said rinse combination is a dioxane:methanol mixture followed by a subsequent rinse with methanol.

9. A process for preparing negative resists on a substrate which includes bonding polymer resins to a siliceous substrate and lithographically preparing a patterned resist in said substrate, which process comprises:
A. forming an article consisting essentially of:
(1) a siliceous substrate;
(2) a layer of silane on a surface of said substrate, which silane is: $R^{i}$—(O)$_{0-1}$—($R^{ii}$)$_{0-1}$—Si($R^{iii}$)$_3$ or the hydrolysis products thereof and wherein one or more of the $R^{iii}$ groups are replaced by OH;

where:
$R^{i}$ is acryloyl, methacryloyl, or vinyl, and when $R^{i}$ is vinyl, then the moiety "(O)$_{0-1}$" is absent;
$R^{ii}$ is alkylene having 2–6 carbon atoms, or $R^{iv}$—N—H—$R^{v}$ where $R^{iv}$ is hydroxyalkylene having 2–6 carbon atoms and $R^{v}$ is alkylene having 2–6 carbon atoms, and when $R^{i}$ is vinyl, $R^{ii}$ is absent;
$R^{iii}$ is halo, or alkoxy having 1–6 carbon atoms, or alkoxyalkoxy having at least 3–6 carbon atoms, or alkanoyloxy having a total of 2–5 carbon atoms, or an alkyl having 1–6 carbon atoms, where the number of said alkyl groups present is not more than 2, and mixtures thereof; and (3) a polymer resin overlaying said silane, which resin affords free radicals when subjected to radiation and is selected from the group consisting of:
(a) polystyrene;
(b) halogenated polystryene, and
(c) substituted styrene polymer, where the substituted monomer has at least one substituent selected from the group consisting of alkyl having 1–4 carbon atoms, halo, haloalkyl having 1–4 carbon atoms and at least one halo; and
(d) mixtures thereof;

B. applying said layer of silane to the siliceous substrate, heating the silane-coated surface of the substrate to form a bond between the silane and the substrate, then applying the polymer resin overlay to the silane coated surface, and irradiating the polymer-overlaid surface (1) to generate free radicals at the polymer-silane interface so as to form a bond between the silane and the polymer overlay, so that a substantially unitary article is obtained, and (2) to form a negative pattern image therein; and C. developing said image by:
(i) dissolving away unexposed polymer with a developer solvent, and
(ii) multiply rinsing said wet developed resist with solvent/nonsolvent rinses, such that a series on consecutive rinses utilizing sucessively weaker solvents is employed, and maintaining the resist in a wetted condition throughout the consecutive rinses, so as to substantially eliminate any snakiness of the developed resist pattern image and to shrink any swelling of the developed resist profile, so that the developed resist image is substantially the same shape and height as the initial exposed image prior to development, where said developer solvent//rinse nonsolvents combination are selected from the following schedule, wherein (d/s) is developer solvent and (r//ns) represents the rinse nonsolvent series which beings with (a) or a mixture of (a) and (b) which is rich in (a) and progresses toward only (b), and where the series of rinses encompasses a minimum of two rinses:

| Schedule 2 | | |
|---|---|---|
| A. | (d/s) | $R_2$—(OCH$_2$CH$_2$)$_m$—O—H |
| | (r/ns) | (a) $R_5$—(OCH$_2$—CH$_2$)$_m$—OH |
| | | (b) R—OH |
| B. | (d/s) | $R_7$—(OCH$_2$CH$_2$)$_m$—O—$R_7$ |
| | (r/ns) | (a) $R_5$—(OCH$_2$CH$_2$)$_m$—OH |
| | | (b) R—OH |
| C. | (d/s) | R—CO—(OCH$_2$CH$_2$)$_p$—O—(OC)$_{0-1}$—R |

-continued
Schedule 2

|   |       |                                                                                              |
|---|-------|----------------------------------------------------------------------------------------------|
|   | (r/ns)| (a) $R_5$—(OCH$_2$CH$_2$)$_m$—OH                                                            |
|   |       | (b) R—OH                                                                                     |
| D.| (d/s) | $R_2$—(OCH$_2$CH$_2$)$_m$—OH, mixed with $R_2$OH                                            |
|   | (r/ns)| (a) $R_2$—OH                                                                                 |
|   |       | (b) R—OH                                                                                     | where:
R is alkyl having 1–4 carbon atoms,
$R_2$ is alkyl having 4–8 carbon atoms,
$R_5$ is H, methyl or ethyl,
$R_7$ is alkyl having 1–8 carbon atoms,
m is an integer equal to 1–4, and
p is an integer equal to 1–2.

10. The process of claim 9 where said silane is 3-methacryloxypropyltrimethoxysilane.

11. The process of claim 9 wherein said negative resist polymer is selected from the group consisting of poly(3-chlorostyrene), poly(4-chlorostyrene), poly(2,5-dichlorostyrene), poly(2,6-dichlorostyrene), poly(3,4-dichlorostyrene), poly(4-bromostyrene), poly(chloromethylstyrene) and poly(4-tert-butylstyrene).

12. The process of claim 7 wherein said developer solvent//rinse nonsolvents combination are selected from the following schedule:

|    |       |                                                                                              |
|----|-------|----------------------------------------------------------------------------------------------|
| K. | (d/s) | ethylene glycol mono-R—ether acetate, or diethylene glycol mono-R—ether acetate, or mixture thereof |
|    | (r/ns)| (a) ethylene glycol mono-$R_1$—ether                                                         |
|    |       | (b) alkanol having 1–4 carbon atoms                                                          |
| L. | (d/s) | ethylene glycol mono-$R_2$—ether, or diethylene glycol mono-$R_2$—ether, or mixtures thereof |
|    | (r/ns)| (a) ethylene glycol mono-$R_1$—ether                                                         |
|    |       | (b) alkanol having 1–4 carbon atoms                                                          |
| M. | (d/s) | ethylene glycol di-R—ether, or diethylene glycol di-R—ether, or triethylene glycol di-R—ether, or tetraethylene glycol di-R—ether, or mixtures thereof |
|    | (r/ns)| (a) ethylene glycol mono-$R_1$—ether                                                         |
|    |       | (b) alkanol having 1–4 carbon atoms                                                          |
| N. | (d/s) | ethylene glycol diacetate, or diethylene glycol diactate, or mixtures thereof                |
|    | (r/ns)| (a) ethylene glycol mono-$R_1$—ether                                                         |
|    |       | (b) alkanol having 1–4 carbon atoms                                                          | where:
R is alkyl having 1–4 carbon atoms,
$R_1$ is alkyl having 1–2 carbon atoms, and
$R_2$ is alkyl having 4–8 carbon atoms.

13. The process of claim 12 wherein said developer is ethylene glycol monoethyl ether acetate and said rinse combination is ethylene glycol monoethyl ether followed by a subsequent rinse with 2-propanol.

14. The process of claim 12 wherein said developer is ethylene glycol monobutyl ether and said rinse combination is ethylene glycol monoethyl ether followed by a subsequent rinse with 2-propanol.

15. The process of claim 12 wherein said developer combination is ethylene glycol monoethyl ether acetate followed by a mixture of ethylene glycol monoethyl ether acetate:ethylene glycol monoethyl ether and the rinse combination is ethylene glycol monoethyl ether followed by a subsequent rinse with 2-propanol.

16. The process of claim 12 wherein said developer combination is ethylene glycol monobutyl ether acetate followed by ethylene glycol monoethyl ether acetate and the rinse combination is ethylene glycol monoethyl ether followed by a subsequent rinse with 2-propanol.

* * * * *